United States Patent
Zhu et al.

(10) Patent No.: US 9,633,854 B2
(45) Date of Patent: Apr. 25, 2017

(54) MOSFET AND METHOD FOR MANUFACTURING THE SAME

(75) Inventors: Huilong Zhu, Poughkeepsie, NY (US); Miao Xu, Beijing (CN); Qingqing Liang, Lagrangeville, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/379,433

(22) PCT Filed: Aug. 2, 2011

(86) PCT No.: PCT/CN2011/077917
§ 371 (c)(1),
(2), (4) Date: Dec. 20, 2011

(87) PCT Pub. No.: WO2012/174771
PCT Pub. Date: Dec. 27, 2012

(65) Prior Publication Data
US 2013/0001665 A1    Jan. 3, 2013

(30) Foreign Application Priority Data

Jun. 23, 2011  (CN) .......................... 2011 1 0170497

(51) Int. Cl.
*H01L 29/78*  (2006.01)
*H01L 21/265*  (2006.01)
(Continued)

(52) U.S. Cl.
CPC ....... *H01L 21/2652* (2013.01); *H01L 29/6653* (2013.01); *H01L 29/66545* (2013.01); *H01L 29/66553* (2013.01); *H01L 29/78648* (2013.01)

(58) Field of Classification Search
CPC .... H01L 29/772; H01L 29/78; H01L 29/7855; H01L 29/78696; H01L 29/786; H01L 29/78648; H01L 29/6653; H01L 29/66545; H01L 29/66553; H01L 29/7864; H01L 21/2253; H01L 21/26; H01L 21/265; H01L 21/26506; H01L 21/26513; H01L 21/266; H01L 21/2652; H01L 21/336; H01L 27/01; H01L 27/12; H01L 27/1203; H01L 33/00; H01L 31/0392; H01L 31/18; H01L 31/119; H01L 43/02
(Continued)

(56) References Cited

U.S. PATENT DOCUMENTS 5,608,253 A * 3/1997 Liu .................. H01L 21/823807
257/365
5,923,067 A * 7/1999 Voldman ............. H01L 27/0255
257/349

(Continued)

FOREIGN PATENT DOCUMENTS

CN       1841776 A    10/2006
CN     101364617 A     2/2009

OTHER PUBLICATIONS

Yan et al., "Scaling the Si MOSFET: From Bulk to SOI to Bult", IEEE Transactions of Electron Devices, vol. 39, No. 7, Jul. 1992, pp. 1704-1710 (7 pages total).
(Continued)

*Primary Examiner* — Natalia Gondarenko
(74) *Attorney, Agent, or Firm* — Westman, Champlin & Koehler, P.A.

(57) ABSTRACT

The present disclosure discloses a MOSFET and a method for manufacturing the same, wherein the MOSFET comprises: an SOI wafer comprising a semiconductor substrate, a buried insulating layer, and a semiconductor layer, the buried insulating layer being disposed on the semiconductor substrate, and the semiconductor layer being disposed on the
(Continued)

buried insulating layer; a gate stack disposed on the semiconductor layer; a source region and a drain region embedded in the semiconductor layer and disposed on both sides of the gate stack; and a channel region embedded in the semiconductor layer and sandwiched between the source region and the drain region, wherein the MOSFET further comprises a back gate and a counter doped region, and wherein the back gate is embedded in the semiconductor substrate, the counter doped region is disposed under the channel region and embedded in the back gate, and the back gate has a doping type opposite to that of the counter doped region. The MOSFET can adjust a threshold voltage by changing the doping type of the back gate.

10 Claims, 5 Drawing Sheets

(51) Int. Cl.
  *H01L 29/66* (2006.01)
  *H01L 29/786* (2006.01)
  *H01L 21/26* (2006.01)
(58) Field of Classification Search
  USPC ........................ 257/314, 213–224, 288, 310, 345–349,257/376, E29.264, E21.421; 438/283
  See application file for complete search history.

(56) References Cited

U.S. PATENT DOCUMENTS

| | | | |
|---|---|---|---|
| 6,043,535 A | 3/2000 | Houston | 257/345 |
| 6,084,268 A * | 7/2000 | de Fresart et al. | 257/342 |
| 6,100,567 A * | 8/2000 | Burr | 257/365 |
| 6,383,904 B1 * | 5/2002 | Yu | H01L 29/4908 257/347 |
| 6,686,630 B2 * | 2/2004 | Hanafi et al. | 257/366 |
| 7,704,811 B2 * | 4/2010 | Houston | 438/157 |
| 2002/0105039 A1 | 8/2002 | Hanafi et al. | |
| 2005/0059252 A1 | 3/2005 | Dokumaci et al. | 438/706 |
| 2007/0054480 A1 * | 3/2007 | Zhu et al. | 438/510 |
| 2007/0246753 A1 * | 10/2007 | Chu et al. | 257/288 |
| 2008/0093634 A1 * | 4/2008 | Clark et al. | 257/252 |
| 2009/0090979 A1 * | 4/2009 | Zhu et al. | 257/408 |
| 2009/0212363 A1 * | 8/2009 | Krivokapic | 257/347 |
| 2012/0175497 A1 * | 7/2012 | Hynecek | 250/208.1 |

OTHER PUBLICATIONS

International Search Report and Written Opinion for PCT Application No. PCT/CN2011/077917, dated Apr. 5, 2012, 9 pages.
First Chinese Office Action for Chinese Patent Application No. 201110170497.8, dated Jul. 2, 2014, 13 pages.

* cited by examiner

MOSFET AND METHOD FOR MANUFACTURING THE SAME

CROSS-REFERENCE TO RELATED APPLICATION(S)

This application is a National Phase application of, and claims priority to No. PCT/CN2011/077917, filed Aug. 2, 2011, entitled MOSFET AND METHOD FOR MANUFACTURING THE SAME, which claims to the Chinese Patent Application No. 201110170497.8, filed on Jun. 23, 2011, both the PCT application and Chinese application are incorporated herein by reference in their entireties.

TECHNICAL FIELD

The present disclosure relates to a MOSFET and a method for manufacturing the same, and in particular, to a MOSFET with a back gate and a method for manufacturing the same.

BACKGROUND

An important trend in development of semiconductor technology is scaling down of metal-oxide-semiconductor field effect transistors (MOSFETs) for improving integration level and reducing manufacturing cost. However, it is well known that short channel effects arise as the size of MOSFETs decreases. As the MOSFETs are scaled down, a gate also has a reduced effective length and actually controls fewer charges in a depletion region when a gate voltage is applied. Consequently, a threshold voltage of the MOSFETs drops with a reduced channel length.

In the MOSFETs, it may be desirable on one hand that the threshold voltage of the device is increased to suppress the short channel effects, and on the other hand that the threshold voltage of the device is decreased to reduce power consumption in a low supply voltage application, or in an application using both P-type and N-type MOSFETs.

Channel doping is a known approach of tuning the threshold voltage. However, if the threshold voltage of the device is raised by increasing the doping concentration in the channel region, mobility of carriers drops, which results in a degradation of the device performance. Moreover, ions with a high doping concentration in the channel region may neutralize ions in source/drain regions and ions in regions which adjoin the channel region, which decreases a doping concentration in the region adjacent to the channel region and increases resistance of the device.

It is proposed by Yan et al. in "Scaling the Si MOSFET: From bulk to SOI to bulk", IEEE Trans. Elect. Dev., Vol. 39, p. 1704, July 1992, that short channel effects can be suppressed by disposing a ground plane (i.e. a grounded back gate) under a buried insulating layer in an SOI MOSFET.

However, the above SOI MOSFET comprising a grounded back gate still cannot meet the requirement of the device for the threshold voltage when the channel length of the semiconductor device is kept shrinking.

Therefore, it is still desirable that the threshold voltage of the semiconductor device is adjusted in a controllable manner without increasing the doping concentration in the channel, while the performance of the semiconductor device is not deteriorated.

SUMMARY OF THE DISCLOSURE

The object of the present disclosure is to provide a MOSFET having a threshold voltage adjustable by a back gate.

According to one aspect of the disclosure, there is provided a semiconductor structure, comprising:

an SOI wafer comprising a semiconductor substrate, a buried insulating layer, and a semiconductor layer, the buried insulating layer being disposed on the semiconductor substrate, and the semiconductor layer being disposed on the buried insulating layer;

a gate stack disposed on the semiconductor layer, the gate stack comprising a gate dielectric layer and a gate conductor, and the gate conductor being disposed on the gate dielectric layer;

a source region and a drain region embedded in the semiconductor layer and disposed on both sides of the gate stack; and a channel region embedded in the semiconductor layer and sandwiched between the source region and the drain region, wherein the MOSFET further comprises a back gate and a counter doped region, and wherein the back gate is embedded in the semiconductor substrate, the counter doped region is disposed under the channel region and embedded in the back gate, and the back gate has a doping type opposite to that of the counter doped region.

According to another aspect of the disclosure, there provides a method for manufacturing a semiconductor structure, comprising:

a) providing an SOI wafer comprising a semiconductor substrate, a buried insulating layer, and a semiconductor layer, the buried insulating layer being disposed on the semiconductor substrate, and the semiconductor layer being disposed on the buried insulating layer;

b) forming a dummy gate on the semiconductor layer;

c) performing a first ion implantation to form a back gate in the semiconductor substrate, wherein the back gate adjoins the buried insulating layer;

d) performing a second ion implantation to form a source region and a drain region in the semiconductor layer;

e) removing the dummy gate to form a gate opening;

f) performing a third ion implantation through the gate opening to form a counter doped region in the back gate; and g) forming a gate stack in the gate opening, wherein dopants used in the first ion implantation have a doping type opposite to that of a dopant used in the third ion implantation.

In the MOSFET of the present disclosure, a back gate and a counter doped region are formed in a semiconductor substrate. When a bias voltage is applied to the back gate and the counter doped region, the resultant electric field is applied to the channel region through the buried insulating layer. By forming the counter doped region having the doping type opposite to that of the back gate, it facilitates adjusting a doping profile of the back gate by the counter doped region (for example, lowering the doping concentration of the portion of the back gate overlapping the counter doped region), which in turn facilitates adjusting the threshold voltage of the device.

According to the method of the present disclosure, after the gate opening is formed, a width of the gate opening is reduced by further forming sidewall spacers, which at least cover sidewalls of the gate opening, in the gate opening. The counter doped region is then formed by performing the third ion implantation through the gate opening having a reduced width. The doping elements for the third ion implantation have a doping type opposite to that for the first ion implantation. It facilitates adjusting a doping profile of the back gate by the counter doped region, which in turn facilitates adjusting the threshold voltage of the device. For example, when the sidewalls of the gate opening are covered by the sidewall spacers such that the bottom of the gate opening is exposed, the resultant counter doped region reduces a doping concentration of the portion of the back gate self-aligned with the gate opening having a reduced width; and when both of the sidewalls and the bottom of the gate opening are covered by the sidewall spacers, the doping concentration of the portion of the back gate self-aligned with the gate opening having a reduced width may be unchanged, or lowered, due to the counter doped region, less than the case where the bottom is exposed.

DETAILED DESCRIPTION

Exemplary embodiments of the present disclosure will be described in more details below with reference to the accompanying drawings. For the sake of clarity, various components in the attached drawings are not drawn to scale.

Some particular details of the disclosure will be described below, such as an exemplary semiconductor structure, material, dimension, process step and manufacturing method of the device, for better understanding of the present disclosure. However, it can be understood by one skilled person in the art that these details are not always essential for but can be varied in a specific implementation of the disclosure. Unless the context clearly indicates otherwise, each part of the semiconductor device can be made of material(s) well known to one skilled person in the art.

In the present application, the term "semiconductor structure" means generally the whole semiconductor structure formed at each step of the method for manufacturing the semiconductor device, including all of the layers and regions having been formed.

According to one preferable embodiment according to the present disclosure, the steps shown in FIGS. 1 to 9 are performed for manufacturing a MOSFET.

Figure 1:
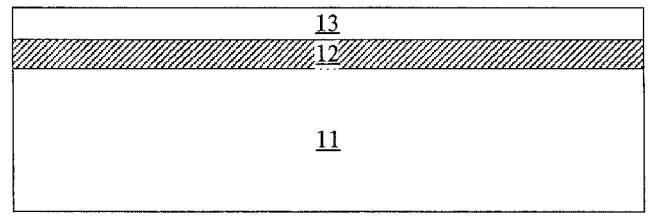
FIGS. 1-9 schematically show cross-sectional views in various stages of a method for manufacturing a MOSFET according to the present disclosure, respectively.

As shown in FIG. 1, an SOI wafer is used as an initial structure of the semiconductor substrate, comprising a semiconductor substrate 11, a buried insulating layer 12 and a semiconductor layer 13, from bottom to top. The semiconductor layer 13 may have a thickness of about 5 nm to 20 nm, such as 10 nm or 15 nm. Moreover, the buried insulating layer 12 may have a thickness of 5 nm to 30 nm, such as 10 nm, 15 nm, 20 nm or 25 nm. The buried insulating layer 12 may be one of a buried oxide layer, a buried oxynitrides layer, and any other buried insulating layer.

The semiconductor substrate 11 may be used for providing a back gate for the MOSFET. The semiconductor substrate 11 may be made of bulk silicon, Group IV semiconductor materials (such as SiGe or Ge), or Group III-V semiconductor materials (such as GaAs). The semiconductor layer 13 may be made of a semiconductor material selected from the group consisting of group IV semiconductor (such as Si, Ge or SiGe) and group III-V compound semiconductor (such as GaAs). In this embodiment, the semiconductor layer 13 may be monocrystalline silicon or SiGe. The semiconductor layer 13 will be used for providing a source region, a drain region and a channel region of the MOSFET.

The process for providing an SOI wafer is well known in the art. For example, a SmartCut™ process (referred as "Smart Cut" or "Smart Strip") can be used for this purpose.

The SmartCut™ process comprises the steps of bonding two wafers with each other, each of which has a surface oxide layer formed by thermal oxidation or deposition, and one of which is subjected to hydrogen implantation so as to form a hydrogen implantation region at a predetermined depth in the silicon body below the surface oxide layer; converting the hydrogen implantation region to a layer having microcavities for subsequent separation, under the conditions of an increased pressure and an increased temperature; and isolating one of the two wafers from the other of the two wafers. The wafer including a surface oxide layer bonded with the semiconductor substrate is used as an SOI wafer. By controlling process parameters in the thermal oxidation or in the deposition, a thickness of the buried insulating layer in the SOI wafer can be changed. By controlling implantation energy during the hydrogen implantation, a thickness of the semiconductor layer in the SOI wafer can be varied.

Figure 2:
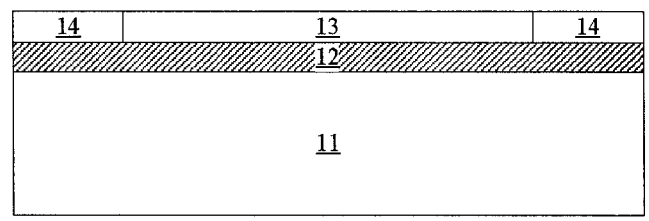

A trench is then formed by patterning the semiconductor layer 13. An insulating material fills the trench so as to form a shallow trench isolation (STI) 14 for defining an active region of the MOSFET, as shown in FIG. 2.

The patterning process may involve the following steps: forming a photoresist mask having a pattern therein on the semiconductor layer 13, by a conventional lithographical process including exposure and development steps; removing the exposed portion of the semiconductor layer 13 by dry etching such as ion beam milling, plasma etching, reactive ion etching, laser ablation and the like, or wet etching using a solution of etchant, stopping on the top of the buried insulating layer 12; and then removing the photoresist mask by ashing or dissolution with a solvent.

Figure 3:
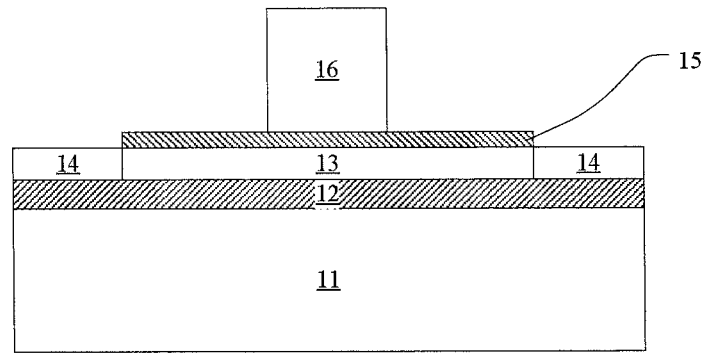

Next, a dummy gate stack is formed on the semiconductor layer 13, as shown in FIG. 3. The dummy gate stack may comprise a gate dielectric layer 15 and a dummy gate 16. The gate dielectric layer 15 may have a thickness of about 1 nm to 4 nm and the dummy gate 16 may have a thickness of about 30 nm to 100 nm. Alternatively, the gate dielectric layer 15 may not be included. The deposition process and patterning processes for forming the gate stack are known in the art, in which the gate conductor 16 is typically patterned into a stripe shape.

The gate dielectric layer 15 may be made of one of oxides, oxynitrides and high-K material (such as, one of $HfO_2$, HfSiO, HfSiON, HfTaO, HfTiO, HfZrO, $Al_2O_3$, $La_2O_3$, $ZrO_2$ and LaAlO or any combination thereof), or any combination thereof. The dummy gate 16 may be of a metal layer, a doped polysilicon layer, or a stack of a metal layer and a doped polysilicon layer. In other embodiments, the dummy gate 16 may comprise insulating materials, such as silicon oxide, silicon oxynitride or silicon nitride.

The channel region comprises the portion (not shown) of the semiconductor layer 13 below the gate stack, and is preferably undoped or self-doped or doped in a previous independent ion implantation process.

Figure 4:
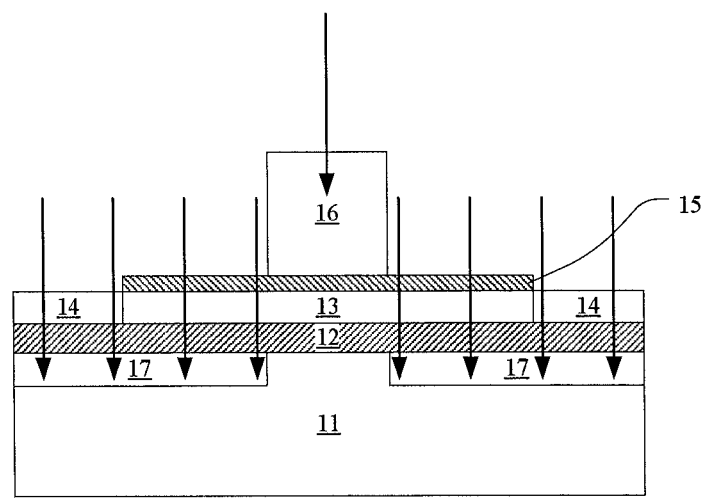

Next, a first ion implantation is performed on the semiconductor substrate 11, as shown in FIG. 4. Because a total thickness of the gate dielectric layer 15, the semiconductor layer 13 and the buried insulating layer 12 is only about 10-50 nm, the implanted ions easily penetrate these layers and reach the semiconductor substrate 11. A depth of implantation is controlled by changing implantation energy and dose, so that the implanted ions are distributed mainly in the semiconductor substrate 11.

The resultant ion implantation region may be distributed in an upper portion of the semiconductor substrate 11 and adjoins the buried insulating layer 12. Alternatively, the resultant ion implantation region is separated from the above buried insulating layer 12 for a certain distance and does not adjoin it directly (not shown).

Due to the blocking by the dummy gate 16, the doping profile is affected by an ion implantation angle. If ions are implanted in a direction perpendicular to the main surface of the SOI wafer in the first ion implantation, the portion of the semiconductor substrate 11 under the dummy gate 16 has a doping concentration less than that of other portions of the semiconductor substrate 11, as shown in FIG. 4. If ions are implanted in a tilt angle with respect to the main surface of the SOI wafer in the first ion implantation, the portion of the semiconductor substrate under the dummy gate has a doping concentration larger than that of other portions of the semiconductor substrate (not shown).

The type of the dopant implanted in the ion implantation step depends on a conductivity type of the MOSFET and a target value of the threshold voltage. To lower the threshold voltage of the semiconductor device, a P-type dopant may be used for a P-type MOSFET, such as boron (B or $BF_2$), indium (In) or their combinations; and an N-type dopant may be used for an N-type dopant, such as arsenic (As), phosphorus (P) or their combinations. To increase the threshold voltage of the semiconductor device, an N-type dopant may be used for a P-type MOSFET, such as arsenic (As), phosphorus (P) or their combinations; and a P-type dopant may be used for an N-type MOSFET, such as boron (B or $BF_2$), indium (In) or their combinations.

A dose of the dopant can be determined according to technological level and product requirements, and may be, for example, about $1\times10^{13}$ $cm^{-2}$ to $1\times10^{15}$ $cm^{-2}$. In such case, the portion of the back gate not under the channel region may have a doping concentration of about $1\times10^{17}$-$1\times10^{25}$ $cm^{-3}$. The portion of the back gate under the channel region may have a doping concentration of about $1\times10^{15}$-$1\times10^{18}$ $cm^{-3}$.

Then, an anneal is performed for a short time after the ion implantation, which is also known as spike anneal, for example, by using laser, electron beam or infrared radiation, so as to remedy damages in the lattice and activate the implanted dopant. Due to the anneal for the ion implantation, the implanted dopant diffuses again to provide a doping profile extending laterally under the dummy gate 16.

Figure 5:
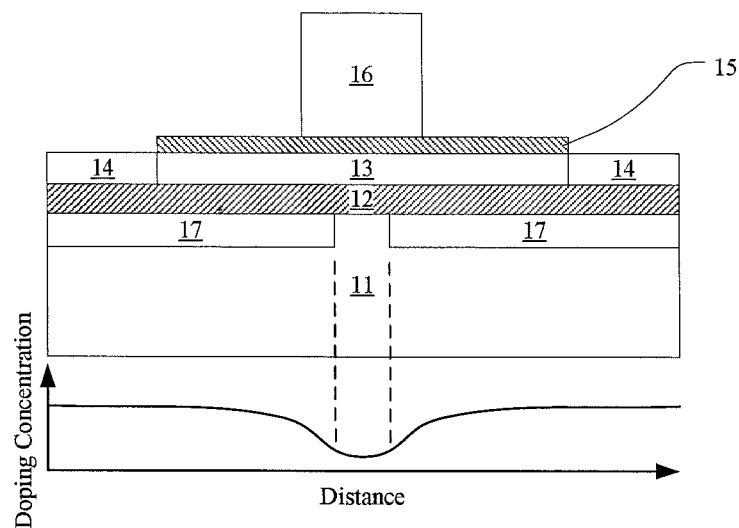

Due to the lateral extension, below the channel region, the back gate 17 has a doping concentration which decreases towards the center of the channel region, up to a minimum value (but not zero) at the center of the channel region (see a curve showing a doping profile in the back gate 17 in FIG. 5).

Figure 6:
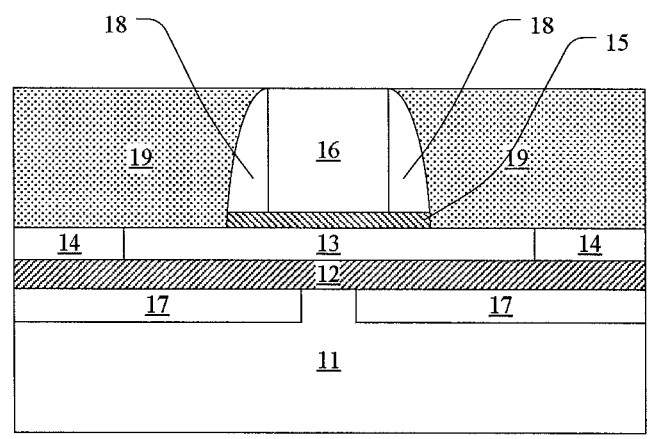

Next, a standard CMOS process may be performed, which comprises: performing a second ion implantation to form a source region and a drain region (not shown) in the semiconductor layer 13; forming sidewall spacers 18 on both sides of the dummy gate 16; forming an interlayer dielectric layer 19 on the semiconductor structure; and removing a portion of the interlayer dielectric layer 19 by chemical-mechanical polishing (CMP), which stops at the top surface of the dummy gate 16 and results in a flat surface of the semiconductor structure, as shown in FIG. 6.

Next, the dummy gate 16 is selectively removed by wet etching or dry etching with the interlayer dielectric layer 19 and the gate dielectric layer 15 as a mask and the portion of the gate dielectric layer 15 under the dummy gate 16 is exposed. A gate opening with a width of L is thus formed. In an alternative embodiment, the gate dielectric layer 15 can also be removed. The gate dielectric layer 15, if being kept, serves as a blocking layer for ion implantation in the subsequent ion implantation process, so as to alleviate damages to the surface of the semiconductor substrate 11 by ion implantation. Otherwise, the semiconductor substrate 11 is exposed.

Next, an auxiliary mask layer is formed on the whole surface of the semiconductor structure. The auxiliary mask layer may be an amorphous silicon layer. The amorphous silicon layer may have a thickness of 5 nm to 15 nm, and may be formed at a temperature of about 300° C. to 400° C. For a semiconductor device having a long gate length (relatively, the gate length L>2d), the amorphous silicon layer covers the sidewalls and the bottom of the gate opening. Next, an anisotropic etching (for example, RIE) may be performed on the amorphous silicon layer without any other mask. In other words, not only the portion of the amorphous silicon outside of the gate opening is removed, but also the portion of the amorphous silicon on the bottom of the gate opening is removed. Other portions of the amorphous silicon layer on inner walls of the gate opening form sidewall spacers 20. The sidewall spacers 20 reduce a width of the gate opening. The reduced width I of the gate opening satisfies the condition I=L−2d approximately.

Figure 7:
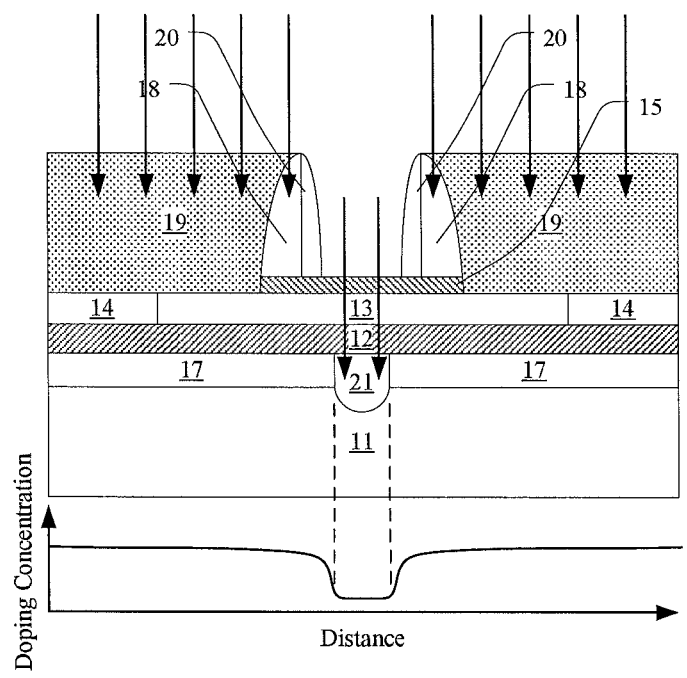

Next, a third ion implantation is performed with the gate opening having a reduced width as a window to form a counter doped region 21 in the semiconductor substrate 11, as shown in FIG. 7. By controlling power and dose for the ion implantation, the third ion implantation may be performed at a depth approximately equal to that for the first ion implantation. The dopant for the third ion implantation may have a doping type opposite to that of the dopant for the back gate implantation step shown in FIG. 4. The counter doped region 21 is disposed under a channel region and embedded in the back gate 17. In this embodiment, the dose for the third ion implantation may be about $1\times10^{13}$ $cm^{-2}$ to $1\times10^{18}$ $cm^{-2}$.

After the counter doped region 21 is formed, the dopants of the opposite doping types in the two ion implantation operations interact with each other such that an effective doping concentration in the portion of the previously formed back gate under the channel region decreases significantly (for the purpose of reducing the threshold voltage). In other words, as for the region occupied by the counter doped region 21, it still appears to be a P-type doped region for an N-type device; or, it still appears to be an N-type doped region for a P-type device. However, it has a doping concentration smaller than that of the portion of the back gate under the channel region. Furthermore, if needed in device design (for example, in order for increase of the threshold voltage), the region occupied by the counter doped region 21 may be reversed to have an opposite doping type. For example, it appears to be an N-type doped region for an N-type device; or, it appears to be a P-type doped region for a P-type device. Therefore, the portion of the back gate under the channel region is used for adjusting a doping profile of the portion of the back gate under the channel region, which facilitates flexibly adjusting the threshold voltage of the device. In this embodiment, the counter doped region 21 may have a doping type opposite to a doping type of the back gate.

Furthermore, for a semiconductor device having a short gate length (relatively, the gate length L<2d), if the auxiliary mask layer is further formed to cover the sidewalls and the bottom of the gate opening after the back gate is formed, the auxiliary mask layer will fill up the gate opening, because the auxiliary mask layer has a thickness d. Thus, the gate opening having a reduced width cannot be formed by removing the auxiliary mask layer which covers the bottom of the gate opening. As a result, either a doping concentration in the portion of the back gate under the channel region cannot be compensated due to the blocking by the auxiliary mask layer, or a sub counter doped region having a doping concentration smaller than the doping concentration of the counter doped region 21, may be formed in the portion of the back gate under the channel region. It prevents the threshold voltage from being reduced to an undesirable low value.

Alternatively, the counter doped region may have a depth larger than that of the back gate, which reduces the possibility of performance degradation by introducing implanted ions into the channel region with an amount as small as possible, when the counter doped region is formed.

Next, an anneal is performed for a short time, for example, by using laser, electron beam or infrared radiation, so as to remedy damages in the lattice and activate the implanted dopant in the counter doped region 21. Due to the anneal for the ion implantation, the implanted dopant diffuses again. A short channel (not shown) is formed in the portion of the semiconductor layer 13 above the counter doped region 21. Compared with a typical long channel, the short channel receives the dopant with a smaller does.

When a bias voltage is applied to the back gate 17, the back gate region 17 and the counter doped region 21 provide two different bias electrical fields. The electric characteristic may be controlled to compensate the short channel effects in the MOSFET.

Next, the sidewall spacers 20 are selectively removed by wet etching. A replacement gate material (for example, the above metal forming the dummy gate 16) is then deposited on the whole surface of the semiconductor structure. The replacement gate material should have a thickness sufficient for filling up the gate opening.

Next, CMP is performed on the replacement gate material to obtain a flat structure surface. In the present application, the term "flat", "planar" or "flush" means that a height difference between any two points in a plane is within a process tolerance. During CMP, the previously formed interlayer dielectric layer 19 is used as a stop layer such that the portion of the replacement gate material outside the gate opening can be removed completely. Other portion of the replacement gate material in the gate opening forms a replacement gate 22 as shown in FIG. 8.

Preferably, in the above steps, the gate dielectric layer 15 may also be removed after the sidewall spacers 20 are removed, if necessary. A new high-K dielectric layer is then formed on the bottom and the inner walls of the gate opening. For example, the new high-K dielectric layer can be the one selected from a group consisting of $HfO_2$, HfSiO, HfSiON, HfTaO, HfTiO, HfZrO, $Al_2O_3$, $La_2O_3$, $ZrO_2$ and LaAlO, or any combination thereof. The high-K dielectric layer may have a thickness of about 1 nm to 3 nm.

More preferably, after the new high-K dielectric layer is formed, a threshold adjustment layer (for example, TiN, TaN, TiAlN, and TaAlN) is formed in the gate opening before the formation of the replacement gate material.

Figure 8:
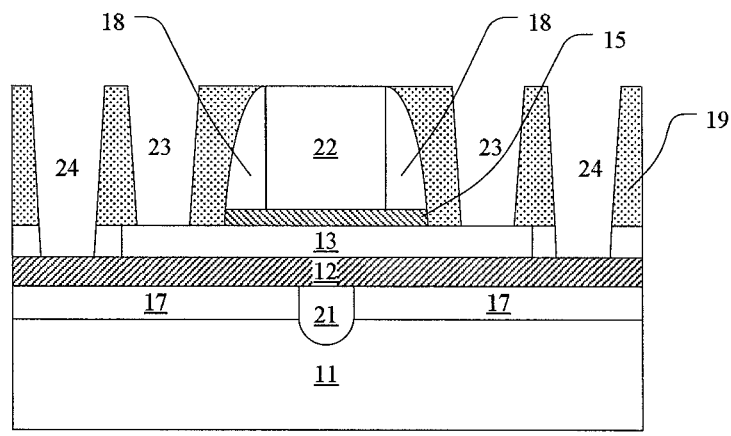

Next, via holes 23 and 24 are formed, as shown in FIG. 8. The via holes 23 extend through the interlayer dielectric layer 19 and reach the source region and the drain region. The via holes 24 extend through the interlayer dielectric layer 19, the isolation regions 14 and the buried insulating layer 12 and reach the back gate 17. It should be noted that when an isolation region is used for isolating the MOSFET from other MOSFETs, the isolation region may preferably have a depth larger than that of the back gate.

Figure 9:
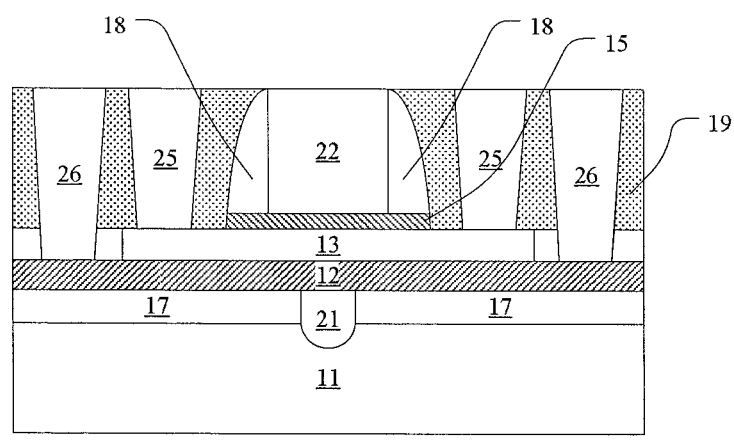

Next, the via holes 23 and 24 are filled with a metal to form conductive vias 25, which are electrically connected to the source region and the drain region, and conductive vias 26, which are electrically connected to the back gate 17, as shown in FIG. 9.

The present disclosure also provides a MOSFET, comprising:

an SOI wafer comprising a semiconductor substrate, a buried insulating layer, and a semiconductor layer, the buried insulating layer being disposed on the semiconductor substrate, and the semiconductor layer being disposed on the buried insulating layer;

a gate stack disposed on the semiconductor layer;

a source region and a drain region embedded in the semiconductor layer and disposed on both sides of the gate stack; and a channel region embedded in the semiconductor layer and sandwiched between the source region and the drain region, wherein the MOSFET further comprises a back gate and a counter doped region, and wherein the back gate is embedded in the semiconductor substrate, the counter doped region is disposed under the channel region and embedded in the back gate, and the back gate has a doping type opposite to that of the counter doped region.

Below the channel region, the back gate has a doping concentration which decreases or increases gradually towards the center of the channel region. Optionally, the back gate has a doping type identical to or opposite to a conductivity type of the MOSFET. Optionally, the back gate adjoins the buried insulating layer. Optionally, the back gate has a doping concentration which increases gradually towards the center of the channel region. Optionally, the counter doped region has a depth larger than that of the back gate. Optionally, the MOSFET further comprising an isolating region for isolating the MOSFET and other MOSFETs, wherein the isolation region has a depth larger than that of the back gate. Optionally, the portion of the back gate not under the channel region has a doping concentration of about $1 \times 10^{17}$-$1 \times 10^{20}$ cm$^{-3}$. Optionally, the portion of the back gate under the channel region has a doping concentration of about $1 \times 10^{15}$-$1 \times 10^{18}$ cm$^{-3}$. Optionally, the portion of the counter doped region under the channel region has a doping concentration of about $1 \times 10^{17}$-$1 \times 10^{20}$ cm$^{-3}$. Optionally, dopants in the back gate and the counter doped region are ones selected from a group consisting of boron, indium, phosphor, arsenic and antimony, or any combination thereof, respectively.

The structures, materials and methods for various parts in the embodiment of the MOSFET are similar to those having been described for the embodiments of the method for manufacturing the MOSFET. Detailed description is omitted here for simplicity.

While the disclosure has been described with reference to specific embodiments, the description is illustrative of the disclosure. The description is not to be considered as limiting the disclosure. The description is not to be considered as limiting the disclosure. Various modifications and applications may occur for those skilled in the art without departing from the true spirit and scope of the disclosure as defined by the appended claims.

We claim:
1. A MOSFET, comprising:
an SOI wafer comprising a semiconductor substrate, a buried insulating layer and a semiconductor layer, the buried insulating layer being disposed on the semiconductor substrate, and the semiconductor layer being disposed on the buried insulating layer;

a gate stack disposed on the semiconductor layer;
a source region and a drain region embedded in the semiconductor layer and disposed on both sides of the gate stack; and
a channel region embedded in the semiconductor layer and sandwiched between the source region and the drain region;
wherein:
the MOSFET further comprises a back gate and a counter doped region, and wherein the back gate is embedded in the semiconductor substrate and isolated from the channel region by the buried insulating layer, the counter doped region is disposed under and aligned to the channel region and embedded in the back gate and adjoins the back gate on opposite sides of the counter doped region, and the back gate has a doping type opposite to that of the counter doped region;
the counter doped region is shorter than a gate length and is isolated from the channel region by the buried insulating layer;
below the channel region, the back gate has a doping concentration which gradually decreases laterally towards a center of the channel region; and
a portion of the back gate that is not under the channel region has a higher doping concentration than a portion of the back gate that is under the channel region.

2. The MOSFET according to claim 1, wherein the back gate has a doping type identical to or opposite to a conductivity type of the MOSFET.

3. The MOSFET according to claim 1, wherein the back gate adjoins the buried insulating layer.

4. The MOSFET according to claim 1, wherein the counter doped region has a depth larger than that of the back gate.

5. The MOSFET according to claim 1, further comprising an isolating region for isolating the MOSFET and other MOSFETs, wherein the isolation region has a depth larger than that of the back gate.

6. The MOSFET according to claim 1, wherein the portion of the back gate not under the channel region has a doping concentration of about $1 \times 10^{17}$-$1 \times 10^{20}$ cm$^{-3}$.

7. The MOSFET according to claim 6, wherein the portion of the back gate under the channel region has a doping concentration of about $1 \times 10^{15}$-$1 \times 10^{18}$ cm$^{-3}$.

8. The MOSFET according to claim 1, wherein a portion of the counter doped region under the channel region has a doping concentration of about $1 \times 10^{17}$-$1 \times 10^{20}$ cm$^{-3}$.

9. The MOSFET according to claim 1, wherein dopants in the back gate and the counter doped region are ones selected from a group consisting of boron, indium, phosphor, arsenic and antimony, or any combination thereof, respectively.

10. The MOSFET according to claim 1, wherein counter doped concentration in the counter doped region decreases with decreasing of the channel length.

* * * * *